(12) United States Patent
Kautz et al.

(10) Patent No.: US 10,527,653 B2
(45) Date of Patent: Jan. 7, 2020

(54) ULTRA-HIGH BANDWIDTH CURRENT SHUNT

(71) Applicant: FORD GLOBAL TECHNOLOGIES, LLC, Dearborn, MI (US)

(72) Inventors: Richard William Kautz, Rochester, MI (US); Xi Lu, Northville, MI (US); Zhuxian Xu, Novi, MI (US); Guangyin Lei, Dearborn Heights, MI (US); Chingchi Chen, Ann Arbor, MI (US); Lan Yu, Canton, MI (US); Michael W. Degner, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 379 days.

(21) Appl. No.: 15/474,489

(22) Filed: Mar. 30, 2017

(65) Prior Publication Data

US 2018/0284160 A1    Oct. 4, 2018

(51) Int. Cl.
*G01R 15/14*    (2006.01)
*G01R 19/00*    (2006.01)

(52) U.S. Cl.
CPC .................. *G01R 19/0092* (2013.01)

(58) Field of Classification Search
CPC ... G01R 1/203; G01R 15/146; G01R 19/0007
See application file for complete search history.

(56) References Cited

U.S. PATENT DOCUMENTS

| 7,098,670 | B2 | 8/2006 | Cole |
| 7,222,033 | B1 | 5/2007 | Newson et al. |
| 2013/0069632 | A1* | 3/2013 | Wagoner ................ G01R 1/203 |
| | | | 324/126 |
| 2014/0297209 | A1* | 10/2014 | Dilly .................... G01R 21/133 |
| | | | 702/61 |

* cited by examiner

*Primary Examiner* — Tung X Nguyen
(74) *Attorney, Agent, or Firm* — David Kelley; Brooks Kushman P.C.

(57) ABSTRACT

A method includes measuring an impedance of a shunt as a function of frequency and converting the impedance to an admittance in a time domain. The method further includes connecting the shunt in a circuit and measuring voltage data across the shunt over a predetermined interval. The method includes outputting a signal indicative of a current through the shunt derived from the voltage data convolved with the admittance. The method may be implemented in a controller configured to interface with the shunt.

18 Claims, 6 Drawing Sheets the IGBT.

ULTRA-HIGH BANDWIDTH CURRENT SHUNT

TECHNICAL FIELD

This application is generally related to a current shunt having improved accuracy at high frequencies.

BACKGROUND

Current shunts are utilized in a variety of applications in which current through a circuit is to be measured. Current shunts are placed in-line with the circuit and can affect the operating characteristics of the circuit. A current shunt is selected for an application based on the expected current flow through the circuit.

SUMMARY

A current measurement system includes a shunt and a controller configured to measure a plurality of voltage values across the shunt over a predetermined interval and output a signal indicative of a current flowing through the shunt and derived from a convolution of the voltage values and a time-domain admittance of the shunt.

The controller may be configured to post-process the voltage values after the predetermined interval is expired. The time-domain admittance may be derived from an inverse Fourier transform. The controller may be further configured to generate a comparison signal indicative of the current and derived from a product of the voltage values and an inverse of a resistance of the shunt. The controller may be further configured to, in response to a rate of change of the current having a magnitude greater than a predetermined magnitude, change the signal at a rate of change that is different than a rate of change of the comparison signal.

A method includes measuring an impedance of a shunt as a function of frequency and converting the impedance to an admittance in a time domain. The method further includes connecting the shunt in a circuit. The method further includes measuring, by a controller, voltage data across the shunt over a predetermined interval. The method further includes outputting, by the controller, a signal indicative of a current through the shunt and derived from the voltage data convolved with the admittance.

The admittance as a function of frequency may be an inverse of the impedance expressed as a function of frequency. The signal may be different than a comparison signal derived from the voltage data divided by a resistance of the shunt when a rate of change of the current exceeds a predetermined magnitude. A rate of change of the current associated with the signal may be different than a rate of change of the current associated with a comparison signal derived from the voltage data divided by a resistance of the shunt. The current through the shunt may be characterized by an overshoot and, the overshoot associated with a comparison signal derived from the voltage data divided by a resistance of the shunt may be different than an overshoot associated with the signal. The current through the shunt may be characterized by an undershoot and, the undershoot associated with a comparison signal derived from the voltage data divided by a resistance of the shunt may be different than an overshoot associated with the signal. The admittance in the time domain may be derived from an inverse Fourier transform of an inverse of the impedance in a frequency domain.

A method includes characterizing an admittance of a shunt in a frequency domain and converting the admittance to a time domain transfer function. The method further includes connecting the shunt in a circuit to measure a current. The method further includes operating the circuit to vary the current. The method further includes outputting, by a controller, current data derived from convolving voltage data measured across the shunt during operation of the circuit with the time domain transfer function of the admittance.

The method may further include post-processing the voltage data to output the current data after operation of the circuit. Converting the admittance to the time domain transfer function may include performing an inverse Fourier transformation on the admittance characterized in the frequency domain. Characterizing the admittance may include measuring an impedance in the frequency domain using a network analyzer. The circuit may include an insulated gate bipolar transistor (IGBT) and operating the circuit may include switching the IGBT on and off. The method may further include measuring a voltage across the IGBT. The method may further include outputting switching loss data for the IGBT based on the current data and the voltage across the IGBT.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Current through an electrical circuit may be measured by a current shunt (also referred to as a shunt). The current shunt may be a resistor that is disposed within the electrical circuit. Under ideal conditions, the current passing through the current shunt causes a voltage across the shunt according to a product of the current and a resistance (Ohm's law) of the shunt. A characteristic of the current shunt is a low resistance value so that the voltage drop across the current shunt is a relatively small value such that the voltage drop does not impact other devices in the circuit.

Figure 1:
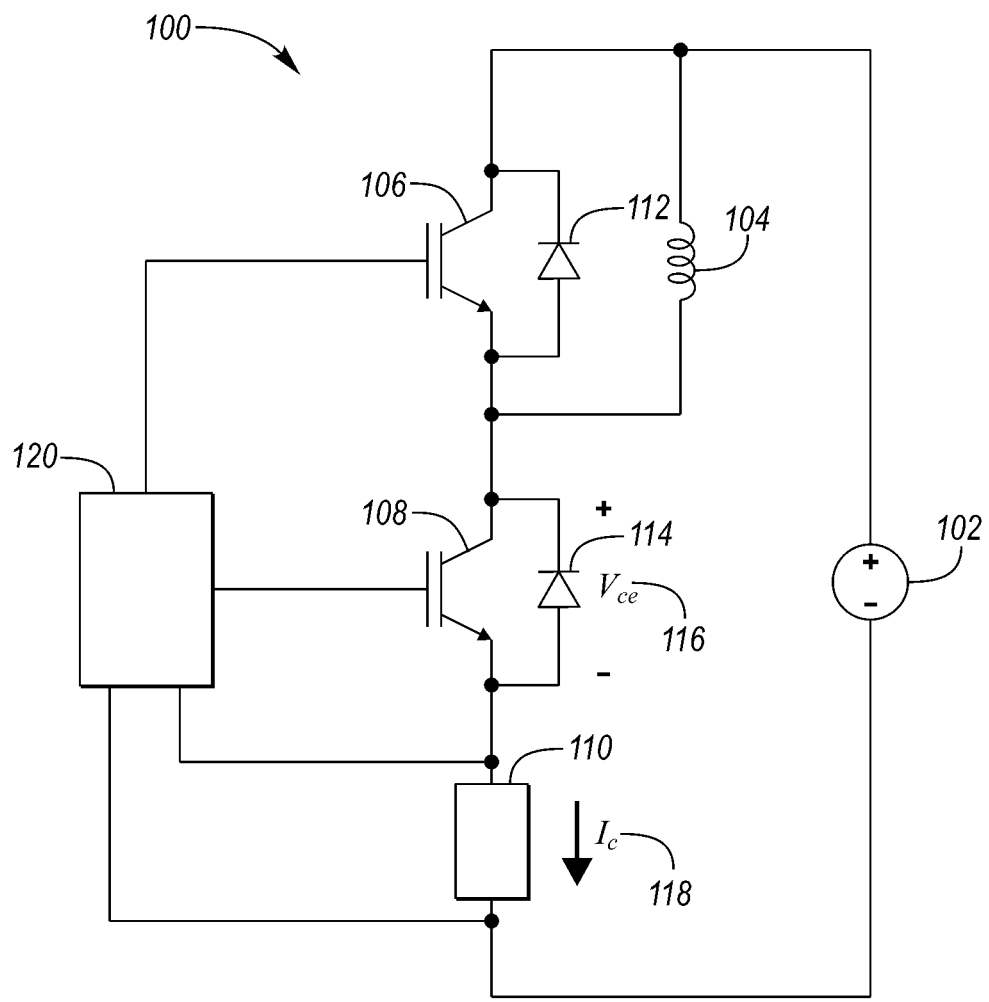
FIG. 1 depicts a possible application in a circuit for a current shunt.

A current shunt may be used to measure current in a variety of applications. For example, FIG. 1 depicts a circuit 100 for characterizing properties of an Insulated Gate Bipolar Transistor (IGBT). The IGBT may be characterized by switching losses that quantify energy losses during switching transients (e.g., losses during turn on and turn off of the device). The circuit 100 may be used to characterize an IGBT using a double-pulse test. The switching losses of the IGBT may be determined by measuring the voltage across the IGBT and the current flowing through the IGBT. The switching losses are determined by integrating the product of the voltage and the current (e.g., power).

The example circuit 100 may include a power source 102. The power source 102 may be a direct current (DC) power supply, battery, and/or capacitor. The circuit 100 may include a first IGBT 106. A collector terminal of the first IGBT 106 may be electrically coupled to a first terminal (e.g., positive terminal) of the power source 102. A first diode 112 may be electrically coupled between the collector terminal of the first IGBT 106 and an emitter terminal of the first IGBT 106. In inductor 104 may be electrically coupled between the collector terminal of the first IGBT 106 and an emitter terminal of the first IGBT 106.

A current measurement system may include a controller 120. The current measurement system 120 may further include a shunt 110. The shunt 110 may have a first terminal and a second terminal for coupling the shunt 110 in the circuit 100. The controller 120 may include voltage measurement circuitry to measure a voltage across the shunt 110 The voltage measurement circuitry may be configured to filter and scale the voltage. The controller 120 may include a processor for executing instructions. The controller 120 may include volatile and non-volatile memory. The controller 120 may be configured to convert the measured voltages to digital values.

The circuit may also include a second IGBT 108 which may be the IGBT under test. A collector terminal of the second IGBT 108 may be electrically coupled to the emitter terminal of the first IGBT 106. An emitter terminal of the second IGBT 108 may be electrically coupled to a first terminal of the shunt 110. A second terminal of the shunt 110 may be electrically coupled to a second terminal (e.g., negative terminal) of the power source 102. A second diode 114 may be electrically coupled between the collector terminal of the second IGBT 108 and the emitter terminal of the second IGBT 108.

The controller 120 may include gate drive circuitry to interface with gate terminals of the first IGBT 106 and the second IGBT 108. The controller 120 may further include voltage measurement circuitry for measuring a collector-emitter voltage of the second IGBT 108. The controller 120 may be configured to operating the gate drives of the first IGBT 106 and the second IGBT 108 to generate a current pulse for characterizing the second IGBT 108. Details of the double-pulse test for characterizing an IGBT are known to those skilled in the relevant art.

Switching losses may then be computed using the collector-emitter voltage ($V_{ce}$) 116 and current ($I_c$) 118 of the second IGBT 108. The voltage 116 and current 118 may be integrated over an interval that includes the switching time. Switching losses may be computed for both switching on the second IGBT 108 and switching off the second IGBT 108. It is apparent that the accuracy of the switching loss characterization depends upon the accuracy of the voltage and current measurements.

For a purely resistive current shunt, the current passing through the shunt may be determined as the voltage across the shunt divided by the resistance value of the shunt. A purely resistive current shunt may be categorized as a high-bandwidth current shunt. The high-bandwidth current shunt provides an accurate current value as the voltage and current are linearly related. Current shunts, however, may not be purely resistive and may include a parasitic inductance. The impedance of an inductor increases as a function of frequency. At low frequencies, the parasitic inductance may not be an issue. However, at high frequencies, the impedance may affect performance. For example, a measured voltage across the current shunt may include voltage components due to the additional impedance. Relying solely on the measured voltage and stated resistance of the current shunt may result in an inaccurate current reading. Depending on the amount of inductance, the current shunt may be categorized as a low-bandwidth shunt.

Figure 2:
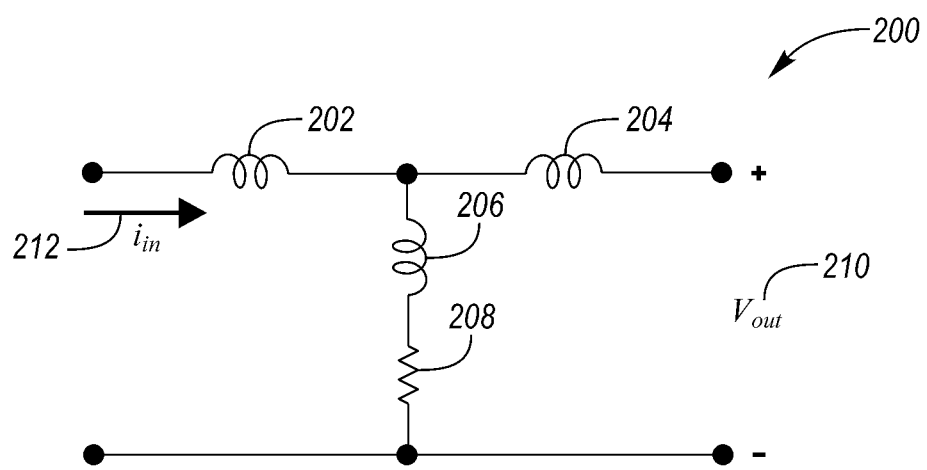
FIG. 2 depicts a circuit model of a current shunt.

FIG. 2 depicts a possible current shunt model 200 that represents the current shunt. The current shunt model 200 may include a first inductive element 202 coupled to a first terminal of the current shunt. The current shunt model 200 may include a second inductive element 206 coupled between the first inductive element 202 and a resistive element 208. The resistive element 208 may be further coupled to a second terminal of the current shunt. A third inductive element 204 may be coupled to the first inductive element 202 and the second inductive element 206. The first inductive element 202, the second inductive element 206 and the third inductive element 204 may form a T-shape network. The third inductive element 204 may be further coupled to a first measurement terminal of the current shunt. An input current 212 flows through the first inductive element 202, the second inductive element 206 and the resistive element 208 to a second terminal of the current shunt. An output voltage 210 is measured across a circuit defined by the third inductive element 204, the second inductive element 206 and the resistive element 208. The voltage measurement circuit that may be coupled to measure the output voltage 210 may be a high-impedance circuit such that negligible current flows through the third inductive element 204.

In a low-bandwidth shunt, the current value may not always be accurately determined using the resistance value. In addition to a voltage drop across the resistive portion of the shunt, there is a voltage drop across the inductive portions. The voltage drop across the inductive portions is a function of the inductance and the rate of change of the current passing through the elements. For an increase in current, the low-bandwidth current shunt may measure a larger voltage than a high-bandwidth current shunt. For a decrease in current, the low-bandwidth current shunt may measure a smaller voltage than the high-bandwidth current shunt. These inductive properties may lead to over or under estimating the current value. It is apparent that using a low-bandwidth current shunt for categorizing switching losses can lead to incorrectly assessing the switching losses.

Figure 3:
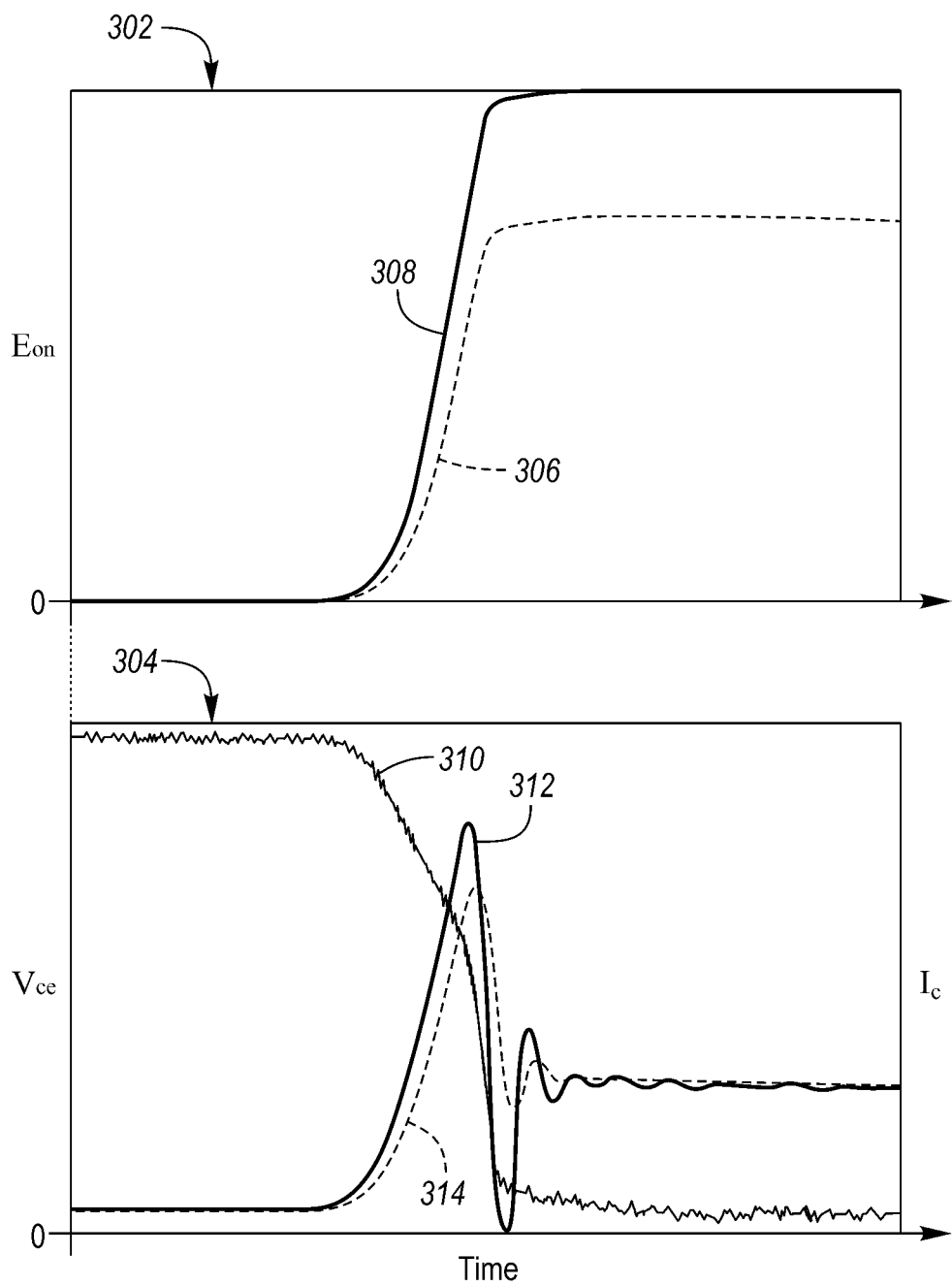
FIG. 3 depicts plots of transistor switch-on performance parameters for a high-bandwidth shunt and an unmodified low-bandwidth shunt.

FIG. 3 depicts graphs of IGBT turn on switching losses derived from a low-bandwidth current shunt and a high-bandwidth current shunt. A switch-on loss graph 302 depicts a high-bandwidth current shunt switch-on loss curve 306 that is derived using a high-bandwidth current shunt. The switch-on loss graph 302 also depicts a low-bandwidth current shunt switch-on loss curve 308 that is derived using a low-bandwidth current shunt. The current value may be derived from a voltage across the shunt divided by a resistance of the shunt. As depicted, the switching losses estimated by the low-bandwidth current shunt are greater than those estimated using the high-bandwidth current shunt. An IGBT voltage/current graph 304 depicts a collector-emitter voltage 310 curve. The IGBT voltage/current graph also depicts a high-bandwidth current shunt collector current 314 and a low-bandwidth current shunt collector current 312. As depicted, the collector current estimated by the low-bandwidth current shunt exhibits a greater rate of change than that estimated using the high-bandwidth current shunt during the switching period.

Figure 4:
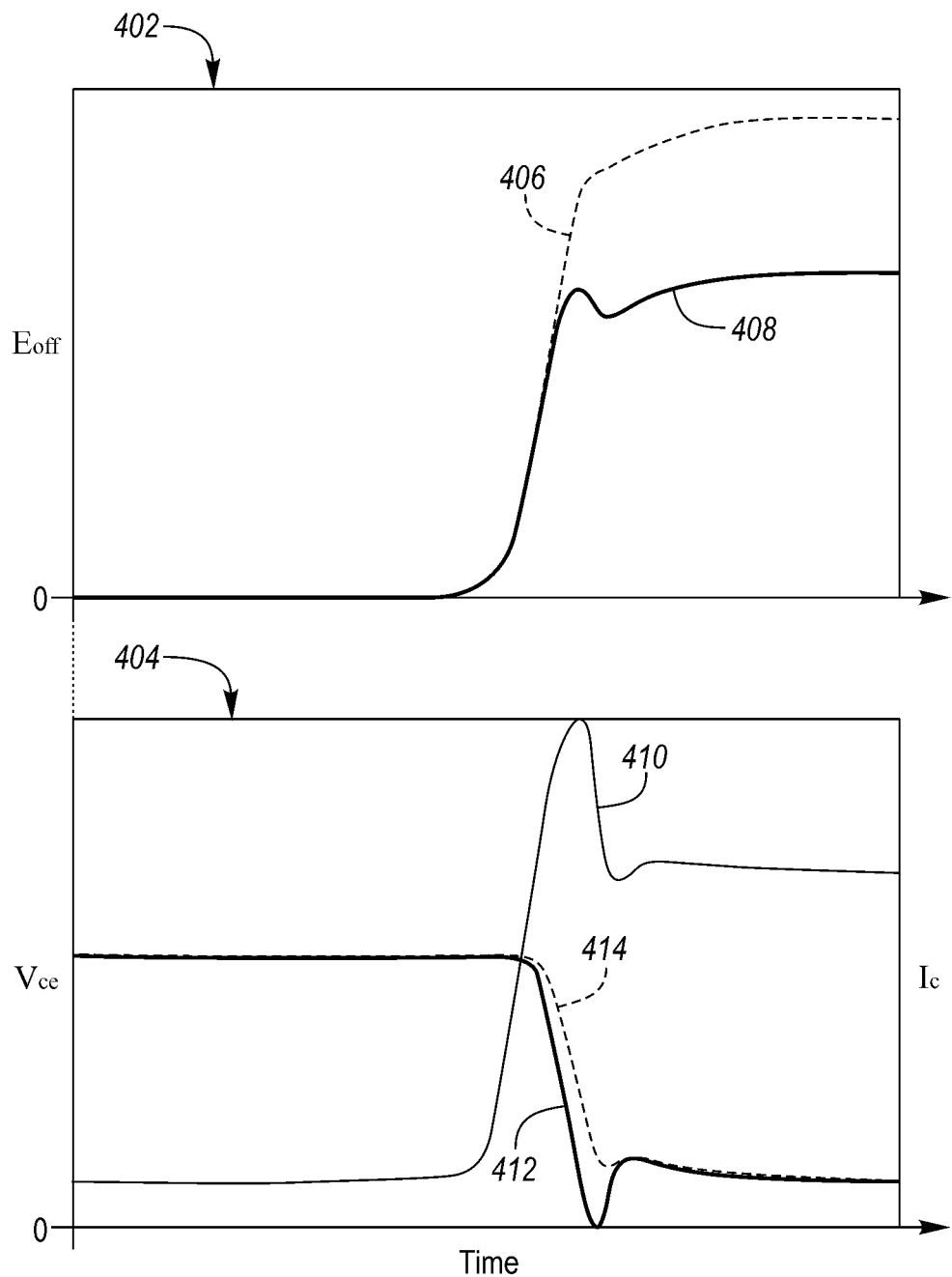
FIG. 4 depicts plots of transistor switch-off performance parameters for a high-bandwidth shunt and an unmodified low-bandwidth shunt.

FIG. 4 depicts graphs of IGBT turn off switching losses derived from a low-bandwidth current shunt and a high-bandwidth current shunt. A switch-off loss graph 402 depicts a high-bandwidth current shunt switch-off loss curve 406 that is derived using a high-bandwidth current shunt. The switch-off loss graph 402 also depicts a low-bandwidth current shunt switch-on loss curve 408 that is derived using a low-bandwidth current shunt. The current value may be derived from a voltage across the shunt divided by a resistance of the shunt. As depicted, the switching losses estimated by the high-bandwidth current shunt are greater than those estimated using the low-bandwidth current shunt. An IGBT voltage/current graph 404 depicts a collector-emitter voltage 410 curve. The IGBT voltage/current graph also depicts a high-bandwidth current shunt collector current 414 and a low-bandwidth current shunt collector current 412. As depicted, the collector current estimated by the high-bandwidth current shunt exhibits less rate of change than that estimated using the low-bandwidth current shunt during the switching period.

One solution is to improve the current shunt design to reduce parasitic inductances. That is, to ensure that the current shunt is purely resistive. Such solutions may result in increased cost of the current shunt.

A method for improving the accuracy of a current shunt may include characterizing a transfer impedance of the current shunt. The circuit of FIG. 2 may be represented by a transfer impedance, $Z_{shunt}$. The transfer impedance may be a function of the frequency. The transfer impedance may be represented as a transfer function between the input current 212 and the output voltage 210. The transfer impedance may be represented in the frequency domain. When expressed in the frequency domain, the transfer impedance ($Z_{shunt}$) may be represented as the output voltage 210 ($V_{out}$) divided by the current 212 ($I_{in}$) through the shunt.

The transfer impedance may be characterized in the frequency domain. The transfer impedance may be measured as a function of the frequency. For example, an input signal of known current amplitude and frequency may be applied to the current shunt. The voltage across the current shunt may be measured. The frequency may be swept across a predetermined range of frequencies to completely characterize the current shunt over the range of frequencies. For example, an inductive load may exhibit an impedance that is greater at high frequencies than at low frequencies. The resulting transfer impedance may be defined by a magnitude and a phase angle in the frequency domain. The characterization procedure may be accomplished utilizing a network analyzer to sweep the input and measure the output. The network analyzer may be a vector network analyzer that measures both the amplitude and phase of the current and voltage signals. Other techniques and methods familiar with a person skilled in the art may be utilized to obtain the transfer impedance of the current shunt in the frequency domain.

To achieve an accurate transfer impedance, special wiring and connectors may be utilized. Measures for lowering the corner frequency for low frequency error may include adding a choke at a first port of an interconnecting cable to increase a shield output loop impedance and using a direct adapter to decrease shield transfer impedance. The measured impedance may be extrapolated to DC (zero frequency).

The resulting impedance may be expressed as a function of frequency (e.g., $Z(\omega)$). The function may be a complex valued function that provides information on the amplitude and phase of the impedance. The impedance may be expressed in terms of discrete frequencies that are based on a fundamental frequency, $\omega_o$. In the discrete case, the impedance may be a function of the discrete frequencies and denoted as $Z(k\omega_o)$, where k is an integer that specifies the multiples of the fundamental frequencies.

Having characterized the impedance of the shunt in the frequency domain, further processing may render the impedance useful for accurately measuring the shunt current. The desired output value of the current shunt is the current value based on a measurement of the voltage across the shunt. In the frequency domain, the shunt current may be represented by the equation: $I_{in}(\omega)=V_{out}(\omega)/Z_{shunt}(\omega)$. The frequency domain transfer impedance, $Z(\omega)$, can be inverted to yield a function of frequency for the inverse of the transfer impedance, $1/Z(\omega)$. The inverse of the transfer impedance may be referred to as the admittance and denoted $Y(\omega)$ (e.g., $Y(\omega)=1/Z(\omega)$). Converting the frequency domain expression to the time domain results in $i(t)=v(t)*Y(t)$, where * represents the convolution of the voltage and admittance. To obtain the current in the time domain, the voltage and admittance are convolved with one another.

To perform the convolution, the admittance is converted to the time domain. The admittance, $Y(\omega)$, may be transformed to the time domain using an inverse Fourier transformation. This may include an inverse discrete-time Fourier transformation. The resulting transformation yields the inverse of the shunt transfer impedance in the time domain. The resulting transformation results in a continuous time transfer function, h(t), or a discrete time transfer function, h(k).

For a continuous-time system, the convolution operation for the shunt current may be expressed as:

$$i(t)=\int_{-\infty}^{\infty}v(\tau)h(t-\tau)d\tau \quad (1)$$

For a discrete-time system, the convolution operation may be expressed as:

$$i[n]=\Sigma_{k=0}^{\infty}v[k]h[n-k]v \quad (2)$$

The functions h(t) or h[k] represents the impulse response of the system. In this case, the impulse response is the admittance (inverse of the impedance) of the current shunt transformed to the time domain. The above equations may be implemented and stored in the controller 120 to solve for the shunt current. The transfer functions may be stored as equations or data points in memory of the controller 120. The controller 120 may be programmed to implement the integration or summation for the convolution operation.

The current shunt 110 may be utilized in a circuit to measure the current within the circuit. The controller 120 may sample the voltage across the shunt (e.g., $V_{out}$ 210) at periodic intervals for a predetermined interval. The result may be a plurality of voltage values or voltage data representing the voltage across the shunt over the predetermined interval. The controller 120 may store the voltage data in memory. After collecting the voltage data, the voltage data may be convolved with the admittance to yield corrected shunt current data. The shunt current data may be a series of data at the same periodic intervals at which the voltage data was sampled. The shunt current data may be stored in memory for later processing. The shunt current data may also be output to other controllers. The controller 120 may be programmed to output a signal indicative of the current flowing through the shunt as the convolution of the voltage values and the admittance of the shunt that is represented as a time domain function.

The techniques described may be utilized as part of a current measurement system. The current measurement system includes the current shunt 110 and the controller 120 and associated circuitry. The controller 120 may store the admittance represented as a time domain function. The time domain function of the admittance and associated parameters may be programmed and stored in the controller 120. During a measurement cycle, the controller 120 may sample the voltage across the current shunt. The controller 120 may be programmed to convolve the measured voltage signal with the time domain function of the admittance to generate the current signal.

The controller 120 may be programmed to periodically measure the voltage across the shunt over a predetermined time interval. After collecting the voltage data over the predetermined time interval, the controller 120 may be programmed to post-process the voltage data after the predetermined time interval is expired. The post-processing may include convolving the voltage data and the admittance expressed as a time-domain function.

The controller 120 may be configured to generate a comparison signal that is indicative of the current flowing through the shunt. The comparison signal may be a product of the voltage across the shunt and an inverse of a shunt resistance. That is, the comparison signal may be derived from the voltage data divided by a resistance of the shunt. The shunt resistance may be a nominal shunt resistance measured under steady-state conditions. The resistance may be constant with respect to frequency. The signal generated by the convolution operation may be different than the comparison signal derived from the voltage data divided by a resistance of the shunt when a rate of change of the current exceeds a predetermined magnitude. The comparison signal may be as depicted in FIG. 3 and FIG. 4 as the low-bandwidth current shunt measurement.

The signal generated by the convolution algorithm may be characterized in that, in response to a rate of change of the current through the shunt being greater than a predetermined magnitude, a rate of change of the processed signal is different than the rate of change of the comparison signal generated using the shunt resistance.

The current through the shunt may be characterized by an overshoot and, the overshoot associated with the comparison signal may be different than an overshoot associated with the signal. The current through the shunt may be characterized by an undershoot and, the undershoot associated with the comparison signal may be different than an overshoot associated with the signal.

Figure 5:
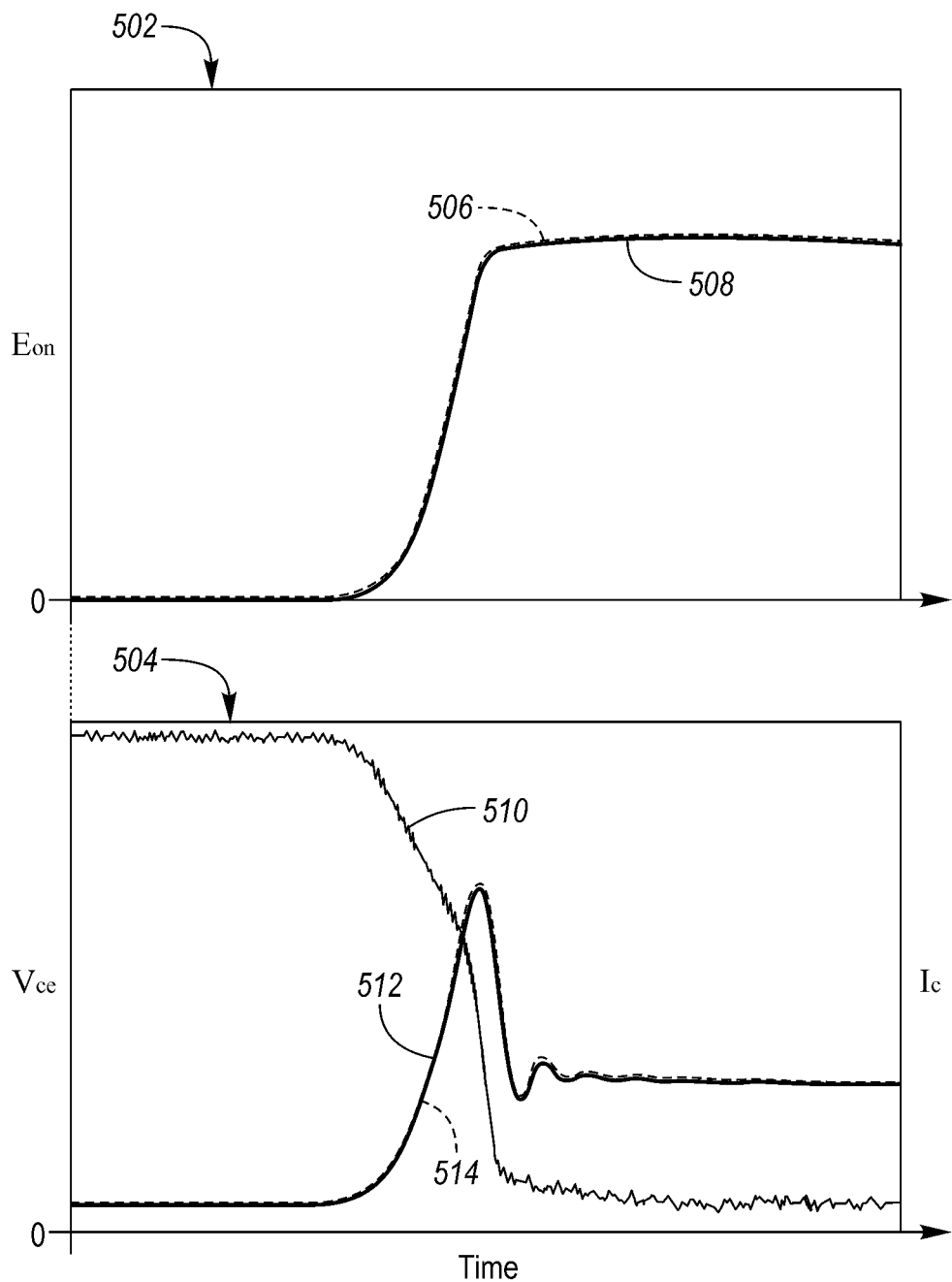
FIG. 5 depicts plots of transistor switch-on performance parameters for a high-bandwidth shunt and a compensated low-bandwidth shunt.

The current measurement system and methods described may be utilized in the circuit 100 of FIG. 1 for characterizing an IGBT. FIG. 5 depicts graphs of IGBT turn on switching losses derived from a low-bandwidth current shunt processed as described above and a high-bandwidth current shunt. A switch-on loss graph 502 depicts a high-bandwidth current shunt switch-on loss curve 506 that is derived using a high-bandwidth current shunt. The switch-on loss graph 502 also depicts a low-bandwidth current shunt switch-on loss curve 508 that is derived using a low-bandwidth current shunt processed as described above. As depicted, the switching losses estimated using the low-bandwidth current shunt are approximately the same as those estimated using the high-bandwidth current shunt. An IGBT voltage/current graph 504 depicts a collector-emitter voltage 510 curve. The IGBT voltage/current graph also depicts a high-bandwidth current shunt collector current 514 and a collector current derived from a low-bandwidth current shunt 512 processed as described above. As depicted, the collector current estimated by the low-bandwidth current shunt closely tracks that estimated using the high-bandwidth current shunt.

Figure 6:
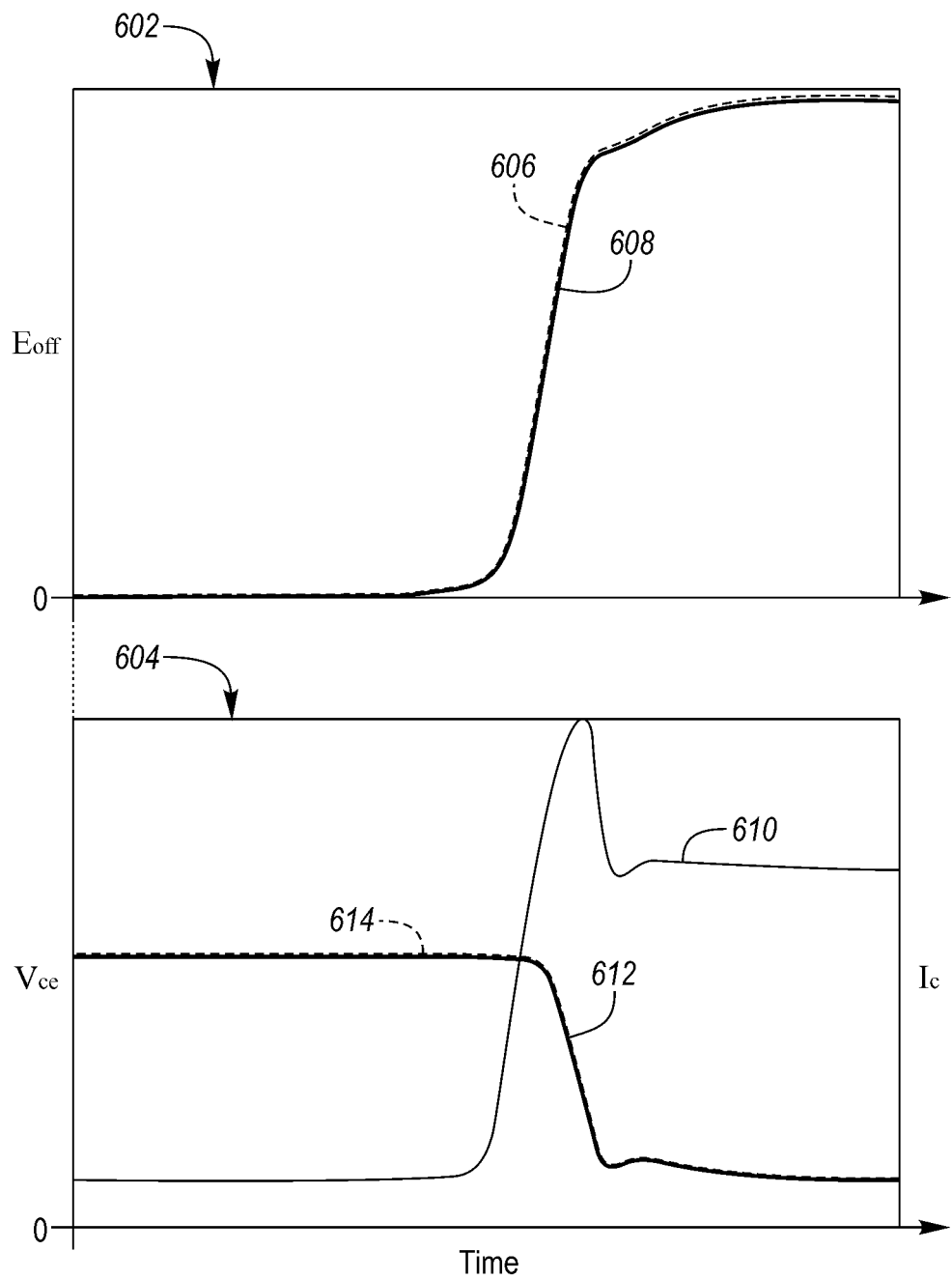
FIG. 6 depicts plots of transistor switch-off performance parameters for a high-bandwidth shunt and a compensated low-bandwidth shunt.

FIG. 6 depicts graphs of IGBT turn off switching losses derived from a low-bandwidth current shunt processed as described above and a high-bandwidth current shunt. A switch-off loss graph 602 depicts a high-bandwidth current shunt switch-off loss curve 606 that is derived using a high-bandwidth current shunt. The switch-off loss graph 602 also depicts a low-bandwidth current shunt switch-off loss curve 608 that is derived using a low-bandwidth current shunt processed as described above. As depicted, the switching losses estimated by the low-bandwidth current shunt are approximately the same as those estimated using the high-bandwidth current shunt. An IGBT voltage/current graph 604 depicts a collector-emitter voltage 610 curve. The IGBT voltage/current graph also depicts a high-bandwidth current shunt collector current 614 and a collector current derived from the low-bandwidth current shunt 612 processed as described above. As depicted, the collector current estimated by the low-bandwidth current shunt closely tracks that estimated using the high-bandwidth current shunt.

Figure 7:
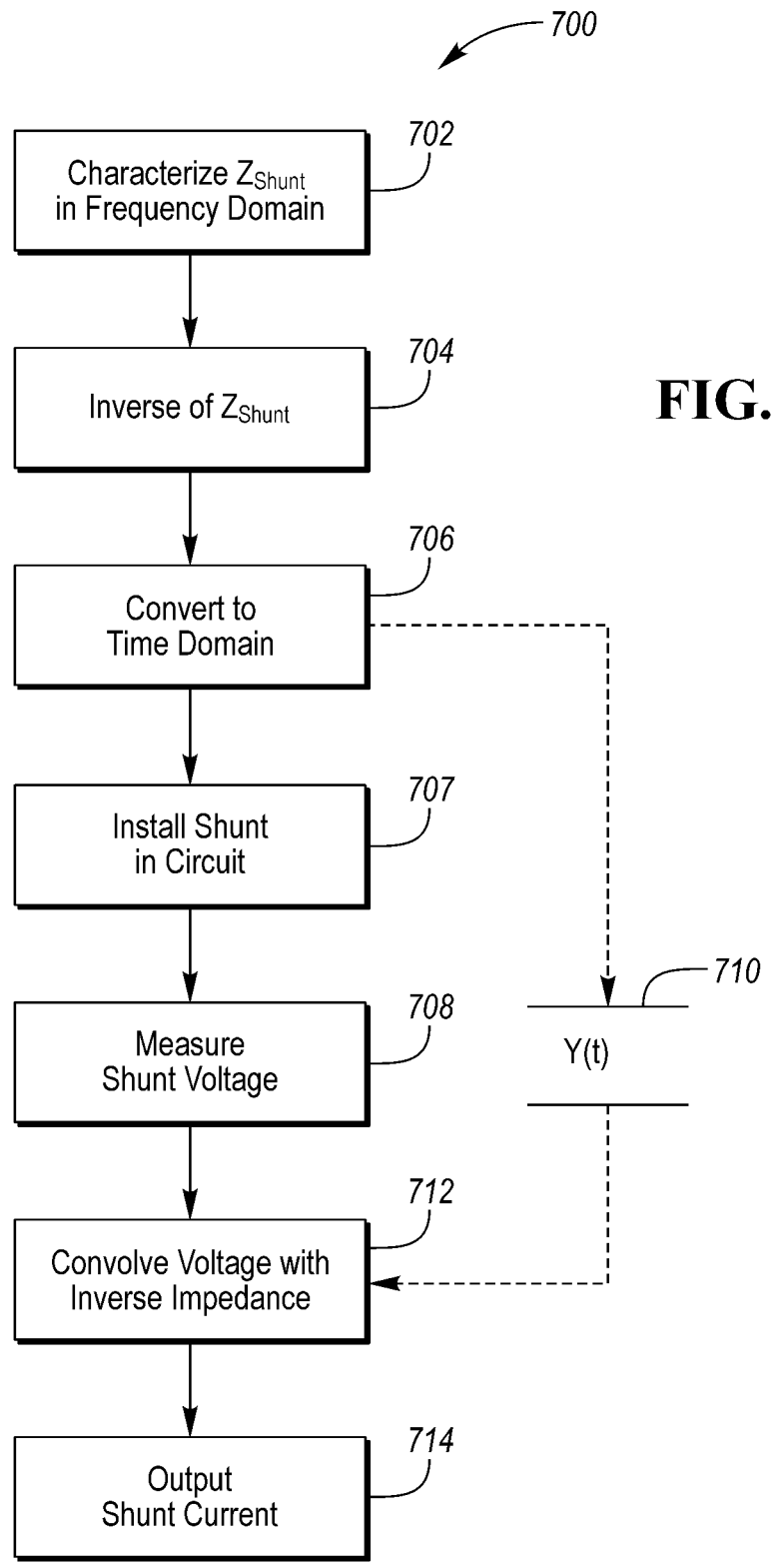
FIG. 7 depicts a flow chart depicting a possible sequence of operations for processing signals from a current shunt.

FIG. 7 depicts a flowchart 700 for a possible sequence of operations for improving the measurement performance of a low-bandwidth current shunt. At operation 702, the impedance of the current shunt may be characterized in the frequency domain. For example, the current shunt being characterized may be coupled to a network analyzer to generate a frequency domain profile. At operation 704, the impedance is inverted (1/impedance) to yield the admittance. At operation 706, the admittance is converted to the time domain. For example, an inverse Fourier transform may be implemented and applied to the admittance. The time-domain representation of the admittance, Y(t), may be stored in a data store 710 which may be controller memory or other storage media.

At operation 707, the shunt may be installed in a circuit. The circuit may then be operated such that current flows through the shunt. For example, the shunt may be installed in a circuit to characterize an IGBT (e.g., as in FIG. 1). Operating the circuit may include switching the IGBT on and off. At operation 708, the voltage across the current shunt may be measured when the current shunt is coupled to a circuit. The voltage may be a series of voltage measurements taken at predetermined intervals for a predetermined duration. In addition, other voltages may be measured. For example, in the IGBT characterization circuit, a voltage across that IGBT may be measured and stored. At operation 712, the voltage data is convolved with the admittance to generate the corrected current values associated with the voltage data. The admittance function may be stored in controller memory. At operation 714, the shunt current data may be output as a signal indicative of the current through the shunt or stored for further processing and analysis. In some configurations, additional signals and/or data may be output. For example, in the IGBT characterization circuit, the switching loss data may be computed based the current data and IGBT voltage data and output to memory or a display.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A current measurement system comprising:
    a shunt; and
    a controller configured (i) measure a plurality of voltage values across the shunt over a predetermined interval and output a signal indicative of a current flowing through the shunt and derived from a convolution of the voltage values and a time-domain admittance of the shunt and (ii) generate a comparison signal indicative of the current and derived from a product of the voltage values and an inverse of a resistance of the shunt.

2. The current measurement system of claim 1 wherein the controller is configured to post-process the voltage values after the predetermined interval is expired.

3. The current measurement system of claim 1 wherein the time-domain admittance is derived from an inverse Fourier transform.

4. The current measurement system of claim 1 wherein the controller may be further configured to, in response to a rate of change of the current having a magnitude greater than a predetermined magnitude, change the signal at a rate of change that is different than a rate of change of the comparison signal.

5. A method comprising:
    measuring an impedance of a shunt as a function of frequency;
    converting the impedance to an admittance in a time domain;
    connecting the shunt in a circuit;
    measuring, by a controller, voltage data across the shunt over a predetermined interval; and
    outputting, by the controller, a signal indicative of a current through the shunt and derived from the voltage data convolved with the admittance.

6. The method of claim 5 wherein the admittance as a function of frequency is an inverse of the impedance expressed as a function of frequency.

7. The method of claim 5 wherein the signal is different than a comparison signal derived from the voltage data divided by a resistance of the shunt when a rate of change of the current exceeds a predetermined magnitude.

8. The method of claim 5 wherein a rate of change of the current associated with the signal is different than a rate of change of the current associated with a comparison signal derived from the voltage data divided by a resistance of the shunt.

9. The method of claim 5 wherein the current through the shunt is characterized by an overshoot and, the overshoot associated with a comparison signal derived from the voltage data divided by a resistance of the shunt is different than an overshoot associated with the signal.

10. The method of claim 5 wherein the current through the shunt is characterized by an undershoot and, the undershoot associated with a comparison signal derived from the voltage data divided by a resistance of the shunt is different than an overshoot associated with the signal.

11. The method of claim 5 wherein the admittance in the time domain is derived from an inverse Fourier transform of an inverse of the impedance in a frequency domain.

12. A method comprising:
    characterizing an admittance of a shunt in a frequency domain and converting the admittance to a time domain transfer function;
    connecting the shunt in a circuit to measure a current;
    operating the circuit to vary the current; and
    outputting, by a controller, current data that is derived from convolving voltage data measured across the shunt during operation of the circuit with the time domain transfer function of the admittance.

13. The method of claim 12 further comprising post-processing the voltage data to output the current data after operation of the circuit.

14. The method of claim 12 wherein converting the admittance to the time domain transfer function includes performing an inverse Fourier transformation on the admittance characterized in the frequency domain.

15. The method of claim 12, wherein characterizing the admittance includes measuring an impedance in the frequency domain using a network analyzer.

16. The method of claim 12 wherein the circuit includes an insulated gate bipolar transistor (IGBT) and operating the circuit includes switching the IGBT on and off.

17. The method of claim 16 further comprising measuring a voltage across the IGBT.

18. The method of claim 17 further comprising outputting switching loss data for the IGBT based on the current data and the voltage across the IGBT.

* * * * *